(12) United States Patent
Youn et al.

(10) Patent No.: US 9,929,297 B2
(45) Date of Patent: Mar. 27, 2018

(54) SOLAR CELL AND METHOD FOR MANUFACTURING THE SAME

(71) Applicant: LG ELECTRONICS INC., Seoul (KR)

(72) Inventors: Eunhye Youn, Seoul (KR); Sangwook Park, Seoul (KR); Seunghwan Shim, Seoul (KR); Yujin Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 492 days.

(21) Appl. No.: 14/151,478

(22) Filed: Jan. 9, 2014

(65) Prior Publication Data
US 2014/0202526 A1    Jul. 24, 2014

(30) Foreign Application Priority Data

Jan. 21, 2013   (KR) .................. 10-2013-0006410

(51) Int. Cl.
| | |
|---|---|
| *H01L 31/065* | (2012.01) |
| *H01L 31/068* | (2012.01) |
| *H01L 31/0352* | (2006.01) |
| *H01L 31/0368* | (2006.01) |
| *H01L 31/0376* | (2006.01) |
| *H01L 31/18* | (2006.01) |

(52) U.S. Cl.
CPC ...... *H01L 31/065* (2013.01); *H01L 31/03685* (2013.01); *H01L 31/03762* (2013.01); *H01L 31/035272* (2013.01); *H01L 31/068* (2013.01); *H01L 31/1824* (2013.01); *Y02E 10/547* (2013.01)

(58) Field of Classification Search
CPC .................. H01L 31/065; H01L 31/1824
USPC .................... 136/255, 256; 438/87
See application file for complete search history.

(56) References Cited

U.S. PATENT DOCUMENTS

2003/0037815 A1    2/2003  Kim et al.
2009/0165855 A1*   7/2009  Sun .................. H01L 31/02167
                                                    136/261

(Continued)

OTHER PUBLICATIONS

Gatz et al., "Analysis of local Al-doped back surface fields for high efficiency screen-printed solar cells", Energy Procedia, vol. 8, 2011, pp. 318-323, XP28263085A.

(Continued)

*Primary Examiner* — Tae-Sik Kang
(74) *Attorney, Agent, or Firm* — Birch, Stewart, Kolasch & Birch, LLP

(57) ABSTRACT

A solar cell and a method for manufacturing the same are discussed. The solar cell includes a substrate containing impurities of a first conductive type, an emitter region which is positioned at a front surface of the substrate and contains impurities of a second conductive type opposite the first conductive type, a back passivation layer which is positioned on a back surface of the substrate and has openings, a back surface field region containing impurities of the first conductive type, a first electrode connected to the emitter region, and a second electrode connected to the back surface field region. The back surface field region includes a first back surface field region positioned on the back passivation layer and a second back surface field region, which is positioned at the back surface of the substrate exposed by the openings of the back passivation layer.

15 Claims, 11 Drawing Sheets

(56) References Cited

U.S. PATENT DOCUMENTS

| | | | |
|---|---|---|---|
| 2009/0325327 A1 | 12/2009 | Rohatgi et al. | |
| 2010/0319763 A1 | 12/2010 | Park et al. | |
| 2011/0265866 A1 | 11/2011 | Oh et al. | |
| 2012/0264253 A1* | 10/2012 | Chiu | H01L 31/18 438/73 |
| 2012/0318349 A1* | 12/2012 | Shim | H01L 31/02167 136/256 |
| 2013/0087195 A1* | 4/2013 | Hovel | H01L 31/18 136/259 |
| 2013/0092218 A1* | 4/2013 | Bedell | H01L 31/0725 136/255 |
| 2013/0160840 A1* | 6/2013 | Lee | H01L 31/022425 136/256 |
| 2013/0255765 A1* | 10/2013 | Gee | H01L 31/18 136/256 |
| 2013/0298973 A1* | 11/2013 | Xie | H01L 31/072 136/255 |

OTHER PUBLICATIONS

Hofmann et al., "Recent developments in rear-surface passivation at Fraunhofer ISE", Solar Energy Materials & Solar Cells, vol. 93, 2009 (available online Jan. 25, 2009), pp. 1074-1078, XP26093572A.

Lai et al., "High-Efficiency Large-Area Rear Passivated Silicon Solar Cells with Local Al-BSF and Screen-Printed Contacts", IEEE Journal of Photovoltaics, vol. 1, No. 1, Jul. 2011, pp. 16-21, XP11387322A.

Schultz et al., "Dielectric Rear Surface Passivation for Industrial Multicrystalline Silicon Solar Cells", IEEE, Fraunhofer Institute for Solar Energy Systems, 2006, pp. 885-889, XP31007447A.

* cited by examiner

SOLAR CELL AND METHOD FOR MANUFACTURING THE SAME

This application claims priority to and the benefit of Korean Patent Application No. 10-2013-0006410 filed in the Korean Intellectual Properly Office on Jan. 21, 2013, the entire contents of which are incorporated herein by reference.

BACKGROUND OF THE INVENTION

Field of the Invention

Embodiments of the invention relate to a solar cell and a method for manufacturing the same.

Description of the Related Art

Recently, as existing energy sources such as petroleum and coal are expected to be depleted, interests in alternative energy sources for replacing the existing energy sources are increasing. Among the alternative energy sources, solar cells for generating electric energy from solar energy have been particularly spotlighted because the solar cells have an abundant energy source that does not cause environmental pollution.

A solar cell generally includes a substrate and an emitter region, which are formed of semiconductors of different conductive types, for example, a p-type and an n-type, and electrodes respectively connected to the substrate and the emitter region. A p-n junction is formed at an interface between the substrate and the emitter region.

When light is incident on the solar cell, a plurality of electron-hole pairs are produced in the semiconductors. The electron-hole pairs are separated into electrons and holes. The electrons move to the n-type semiconductor, for example, the emitter region, and the holes move to the p-type semiconductor, for example, the substrate. Then, the electrons and the holes are collected by the different electrodes respectively connected to the emitter region and the substrate. The electrodes are connected to each other using electric wires to thereby obtain electric power.

SUMMARY OF THE INVENTION

In one aspect, there is a solar cell including a substrate containing impurities of a first conductive type, an emitter region positioned at a front surface of the substrate, the emitter region containing impurities of a second conductive type opposite the first conductive type, a back passivation layer positioned on a back surface of the substrate, the back passivation layer having a plurality of openings, a back surface field region containing impurities of the first conductive type, a first electrode connected to the emitter region, and a second electrode connected to the back surface field region, wherein the back surface field region includes a first back surface field region, which is positioned on the back passivation layer and has a plurality of openings, and a second back surface field region, which is positioned at the back surface of the substrate exposed by the plurality of openings of the back passivation layer.

The second back surface field region may include a crystalline silicon layer which is more heavily doped with impurities of the first conductive type than the substrate. In this instance, an amount of the impurities of the first conductive type contained in the second back surface field region may be equal to or more than an amount of the impurities of the first conductive type contained in the first back surface field region.

The first back surface field region may include a microcrystalline silicon layer which is more heavily doped with impurities of the first conductive type than the substrate.

The first back surface field region may further include an amorphous silicon layer which is positioned between the back passivation layer and the microcrystalline silicon layer and contains impurities of the first conductive type.

A doping concentration of the amorphous silicon layer included in the first back surface field region may be lower than a doping concentration of the microcrystalline silicon layer included in the first back surface field region.

The back passivation layer may include an intrinsic amorphous silicon layer.

The solar cell may further include a dielectric layer which is positioned on the first back surface field region and has a plurality of openings.

The second electrode may physically contact the first back surface field region and the second back surface field region. In this instance, the first back surface field region may be spatially separated from the second back surface field region, and the first back surface field region and the second back surface field region may be electrically connected to each other through the second electrode.

A thickness of the back passivation layer may be about 10 nm to 50 nm. A thickness of the first back surface field region may be about 10 nm to 50 nm. A doping depth of the second back surface field region may be about 3 μm to 5 μm.

A distance between the plurality of openings of the first back surface field region may be about 0.15 mm to 1 mm.

The dielectric layer may be formed of silicon nitride (SiNx).

In another aspect, there is a method for manufacturing a solar cell including forming an emitter region containing impurities of a second conductive type opposite a first conductive type at a front surface of a substrate containing impurities of the first conductive type, forming a back passivation layer including an intrinsic amorphous silicon layer on a back surface of the substrate, forming a first back surface field region on the back passivation layer, selectively irradiating a laser beam onto the first back surface field region to form a plurality of openings in the back passivation layer and the first back surface field region and forming a second back surface field region at the back surface of the substrate exposed by the plurality of openings of the back passivation layer and the first back surface field region, forming a first electrode connected to the emitter region, and forming a second electrode connected to the first back surface field region and the second back surface field region.

The forming of the first back surface field region may include forming a microcrystalline silicon layer, which is more heavily doped with impurities of the first conductive type than the substrate, on the back passivation layer.

The forming of the first back surface field region may further include forming an amorphous silicon layer containing impurities of the first conductive type, of which a doping concentration is lower than a doping concentration of the microcrystalline silicon layer, on the back passivation layer before forming the microcrystalline silicon layer.

The method may further include forming a dielectric layer on the first back surface field region, wherein the laser beam is selectively irradiated onto the dielectric layer.

A process temperature for forming the dielectric layer may be about 300° C. to 400° C.

The second electrode may be formed using a plating method.

The solar cell and the method for manufacturing the same according to embodiments of the invention includes the back surface field region on the back passivation layer and in the back surface of the substrate exposed by the plurality of openings of the back passivation layer, thereby further enhancing a back surface field function and further improving efficiency of the solar cell.

Further, because the back surface field region according to the embodiments of the invention includes the microcrystalline silicon layer, a laser beam having a low energy density may be used to form the back surface field region. Hence, a heat damage of the substrate resulting from the laser beam may be minimized. As a result, the generation of a dark saturation current may be minimized, and the efficiency of the solar cell may be further improved.

Further, because the back surface field region according to the embodiments of the invention includes the amorphous silicon layer, a passivation function of the back passivation layer may be further enhanced.

Further, because the back passivation layer according to the embodiments of the invention is thicker than a related art back passivation layer, the passivation function of the back passivation layer may be further enhanced.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
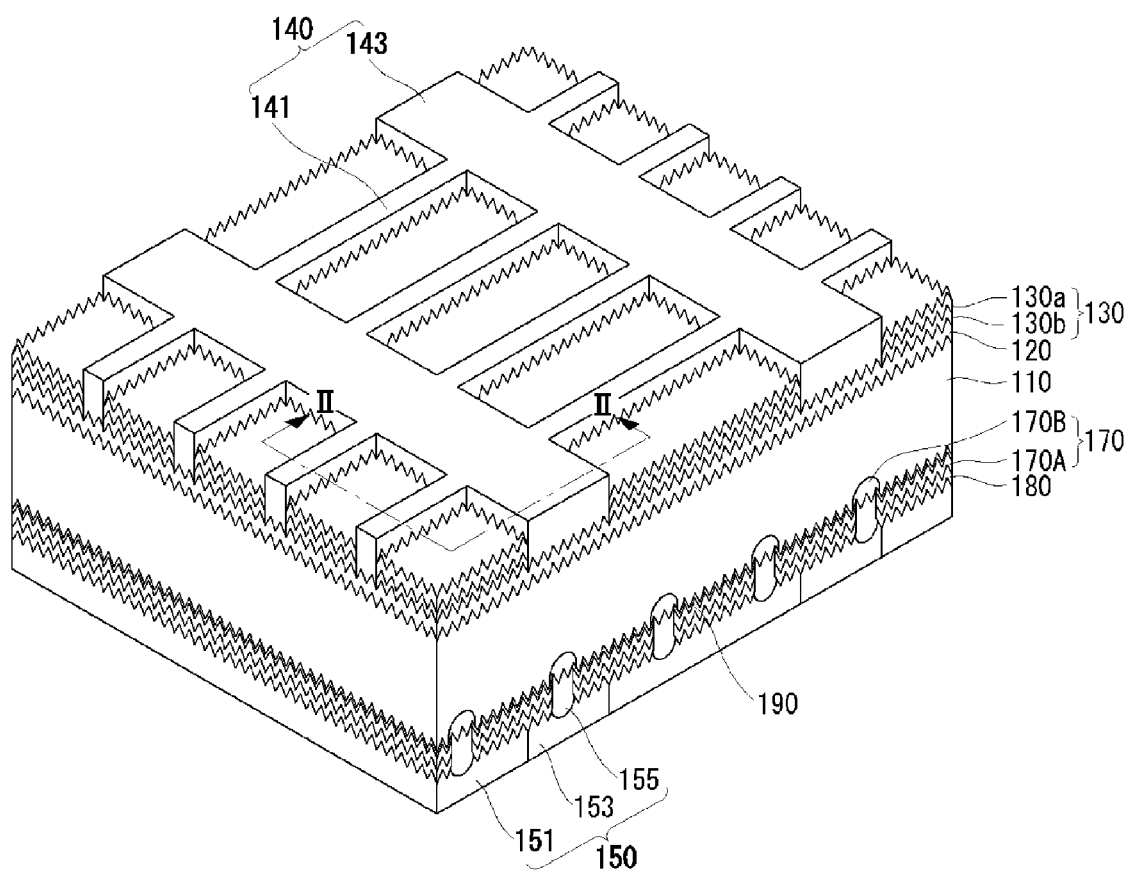
FIG. 1 is a partial perspective view of a solar cell according to an example embodiment of the invention.

Reference will now be made in detail to embodiments of the invention, examples of which are illustrated in the accompanying drawings. This invention may, however, be embodied in many different forms and should not be construed as limited to the embodiments set forth herein. Wherever possible, the same reference numbers will be used throughout the drawings to refer to the same or like parts. It should be noted that a detailed description of known arts will be omitted if it is determined that the known arts can obscure the embodiments of the invention.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, it will be understood that when an element such as a layer, film, region, or substrate is referred to as being "entirely" on other element, it may be on the entire surface of the other element and may not be on a portion of an edge of the other element.

Example embodiments of the invention will be described with reference to FIGS. 1 to 14.

Figure 2:
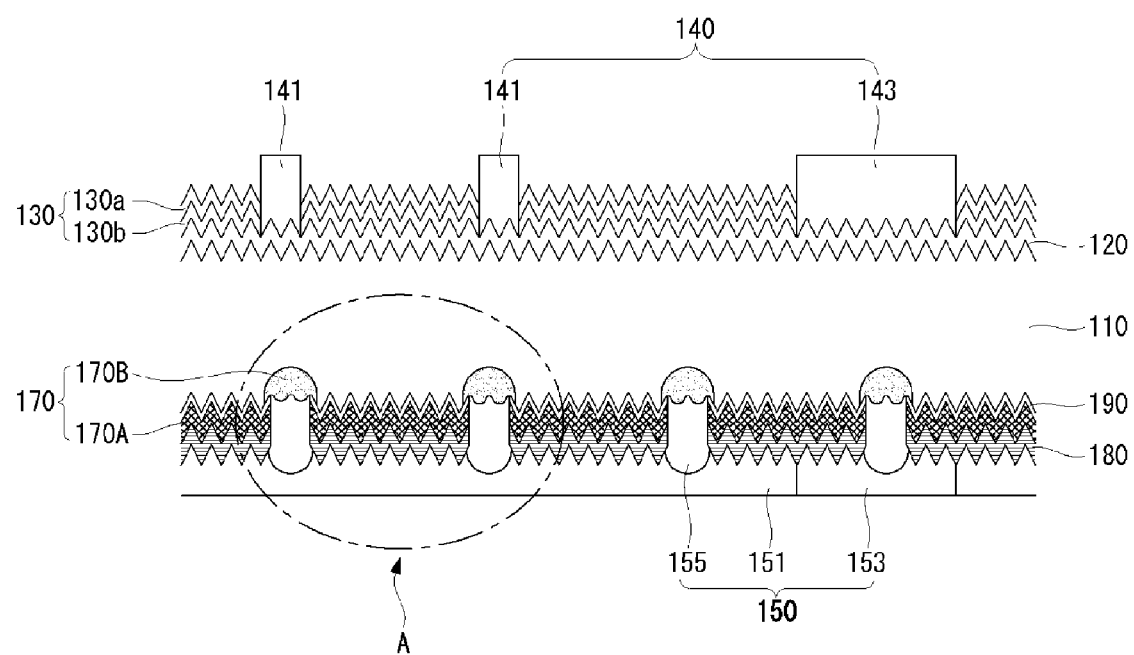
FIG. 2 is a cross-sectional view taken along line II-II of FIG. 1.
Figure 3:
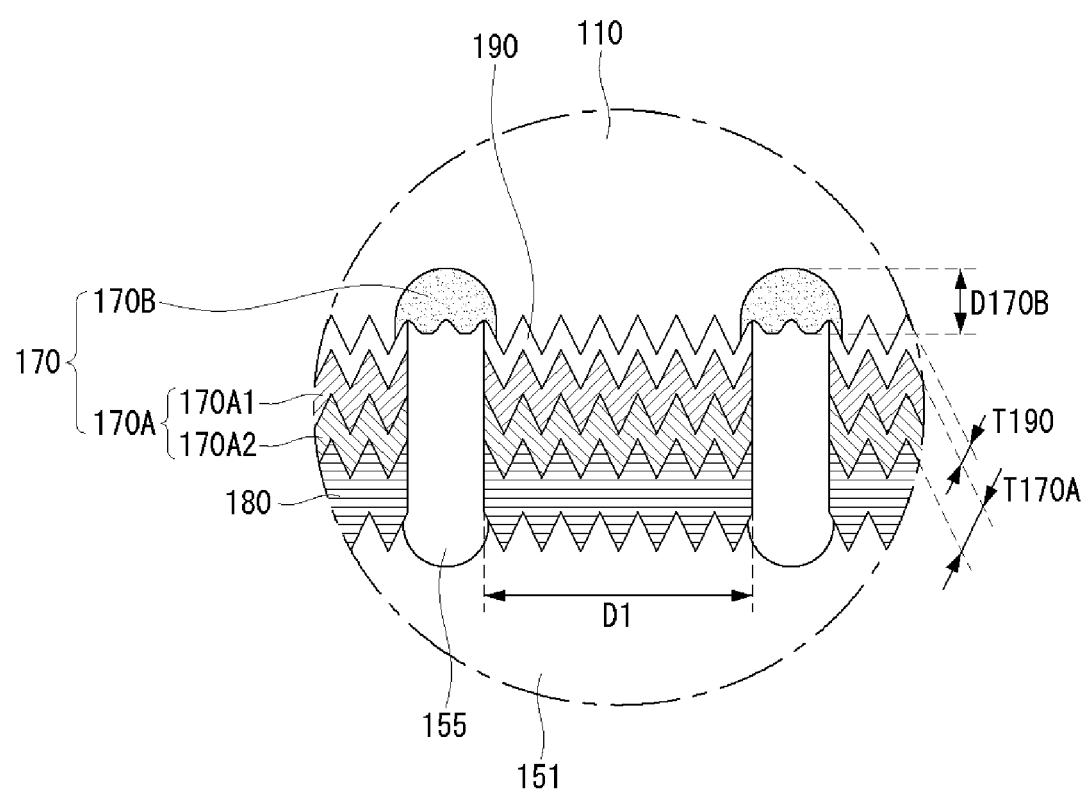
FIG. 3 is an enlarged view of a portion 'A' shown in FIG. 2.

FIG. 1 is a partial perspective view of a solar cell according to an example embodiment of the invention, FIG. 2 is a cross-sectional view taken along line II-II of FIG. 1, and FIG. 3 is an enlarged view of a portion 'A' shown in FIG. 2.

As shown in FIGS. 1 to 3, a solar cell according to an example embodiment of the invention includes a substrate 110, an emitter region 120, an anti-reflection layer 130, a back passivation layer 190, a dielectric layer 180, a back surface field region 170 including a first back surface field region 170A and a second back surface field region 170B, a first electrode 140, and a second electrode 150.

In the embodiment of the invention, the solar cell including the anti-reflection layer 130 and the dielectric layer 180 is described as an example. However, the anti-reflection layer 130 and the dielectric layer 180 may be omitted, if necessary or desired. In an aspect of efficiency of the solar cell, an efficiency of the solar cell including the anti-reflection layer 130 and the dielectric layer 180 is greater than an efficiency of the solar cell not including the anti-reflection layer 130 and the dielectric layer 180. Therefore, the solar cell including the anti-reflection layer 130 and the dielectric layer 180 is described as an example of the embodiment of the invention.

The substrate 110 may be a semiconductor substrate formed of silicon containing impurities of a first conductive type, for example, p-type impurities, though not required. Silicon used in the substrate 110 may be crystalline silicon such as single crystal silicon and polycrystalline silicon. If the substrate 110 is of a p-type, the substrate 110 may contain impurities of a group III element such as boron (B), gallium (Ga), and indium (In). Alternatively, the substrate 110 may be of an n-type and/or may be formed of a semiconductor material other than silicon. If the substrate 110 is of the n-type, the substrate 110 may contain impurities of a group V element such as phosphorus (P), arsenic (As), and antimony (Sb). In the following description, the solar cell is described using the substrate 110 of the n-type as an example.

As shown in FIGS. 1 to 3, the surface of the substrate 110 is textured to form a textured surface corresponding to an uneven surface having a plurality of uneven portions or having uneven characteristics.

The emitter region 120 is positioned at a front surface of the substrate 110, on which light is incident. The emitter region 120 contains impurities of a second conductive type (for example, a p-type) opposite the first conductive type (for example, the n-type) of the substrate 110 to form a p-n junction along with the substrate 110.

Carriers, i.e., a plurality of electron-hole pairs produced by light incident on the substrate 110 are separated into electrons and holes due to the p-n junction between the substrate 110 and the emitter region 120. The electrons move to the n-type semiconductor, and the holes move to the p-type semiconductor. Thus, when the substrate 110 is of the n-type and the emitter region 120 is of the p-type, the separated electrons move to the substrate 110 and the separated holes move to the emitter region 120. Hence, the electrons become major carriers in the substrate 110, and the holes become major carriers in the emitter region 120.

Because the emitter region 120 forms the p-n junction along with the substrate 110, the emitter region 120 may be of the n-type when the substrate 110 is of the p-type unlike the embodiment described above. In this instance, the separated electrons move to the emitter region 120, and the separated holes move to the substrate 110.

Returning to the embodiment of the invention, when the emitter region 120 is of the p-type, the emitter region 120 may be formed by doping the substrate 110 with impurities of a group III element such as B, Ga, and In. On the contrary, if the emitter region 120 is of the n-type, the emitter region 120 may be formed by doping the substrate 110 with impurities of a group V element such as P, As, and Sb.

The emitter region 120 formed at the front surface of the substrate 110 may include a first region, which overlaps and contacts the first electrode 140, and a second region, which does not overlap or contact the first electrode 140. The first region and the second region of the emitter region 120 may have different impurity doping concentrations.

In this instance, the first region of the emitter region 120, which overlaps and contacts the first electrode 140, is formed as a heavily doped region having a relatively high impurity doping concentration. Further, the second region of the emitter region 120, which does not overlap or contact the first electrode 140, is formed as a lightly doped region having an impurity doping concentration lower than the heavily doped region.

The anti-reflection layer 130 is positioned on the emitter region 120. The anti-reflection layer 130 may have a single-layered structure including any one of an aluminum oxide ($Al_2O_3$) layer, a silicon nitride (SiNx) layer, a silicon oxide (SiOx) layer, and a silicon oxynitride (SiOxNy) layer, or a multi-layered structure including at least two of the layers.

FIGS. 1 and 2 show the anti-reflection layer 130 having a double-layered structure as an example. In this instance, the anti-reflection layer 130 includes a first anti-reflection layer 130b formed on the emitter region 120 and a second anti-reflection layer 130a formed on the first anti-reflection layer 130b.

In the embodiment of the invention, the first anti-reflection layer 130b is formed of aluminum oxide ($Al_2O_3$) and has a passivation function as well as an anti-reflection function.

Further, it is preferable, but not required, that the second anti-reflection layer 130a is formed of silicon nitride (SiNx). Other materials may be used. For example, the second anti-reflection layer 130a may be formed of silicon oxide (SiOx) or silicon oxynitride (SiOxNy).

The anti-reflection layer 130 reduces a reflectance of light incident on the solar cell and selectively increases light of a predetermined wavelength band, thereby increasing the efficiency of the solar cell.

The first electrode 140 physically contacts the emitter region 120 and is electrically connected to the emitter region 120. As shown in FIG. 1, the first electrode 140 includes a plurality of finger electrodes 141 and a plurality of front bus bars 143.

The finger electrodes 141 are positioned on the emitter region 120 and are electrically connected to the emitter region 120. The finger electrodes 141 are separated from one another by a uniform distance and extend in a fixed direction. The finger electrodes 141 collect carriers (for example, holes) moving to the emitter region 120.

The front bus bars 143 are positioned on the same level layer as the finger electrodes 141 on the emitter region 120. The front bus bars 143 electrically connect the finger electrodes 141 to one another and extend in a direction crossing the finger electrodes 141. The front bus bars 143 are connected to an interconnector for connecting solar cells. The front bus bars 143 collect carriers, which are collected by the finger electrodes 141 and move, and output the carriers to an external device.

The finger electrodes 141 and the front bus bars 143 of the first electrode 140 may be formed of the same conductive material, for example, at least one selected from the group consisting of nickel (Ni), copper (Cu), silver (Ag), aluminum (Al), tin (Sn), zinc (Zn), indium (In), titanium (Ti), gold (Au), and a combination thereof. Other conductive materials may be used.

As shown in FIGS. 1 and 2, the back passivation layer 190 is positioned on a back surface opposite the front surface of the substrate 110, on which light is incident. The back passivation layer 190 includes an intrinsic (called i-type) amorphous silicon layer formed using a plasma enhanced chemical vapor deposition (PECVD) method, for example. The back passivation layer 190 is entirely formed on the back surface of the substrate 110 and has a plurality of openings.

The back passivation layer 190 prevents or reduces a recombination and/or a disappearance of carriers at and around the back surface of the substrate 110 and improves an inner reflectance of light passing through the substrate 110, thereby increasing reincidence of light passing through the substrate 110.

The back surface field region 170 contains impurities of the first conductive type. As shown in FIGS. 1 to 3, the back surface field region 170 includes the first back surface field region 170A and the second back surface field region 170B.

The first back surface field region 170A is positioned on the back passivation layer 190 and has a plurality of openings. The second back surface field region 170B is formed at the back surface of the substrate 110 exposed by the plurality of openings included in the back passivation layer 190.

The plurality of openings included in the first back surface field region 170A overlap the plurality of openings of the back passivation layer 190. Namely, the openings of the first back surface field region 170A are formed at the same location as the openings of the back passivation layer 190, and a width or a diameter of the opening of the first back surface field region 170A may be the same as the opening of the back passivation layer 190.

The first back surface field region 170A may have a single-layered structure or a multi-layered structure. Preferably, but not required, the first back surface field region 170A may have the multi-layered structure. If the first back surface field region 170A has the multi-layered structure, one layer of the first back surface field region 170A may be formed of amorphous silicon material, and another layer may be formed of microcrystalline silicon material.

The first back surface field region 170A is formed on the back passivation layer 190 using the PECVD method.

The second back surface field region 170B is positioned at the substrate 110. If the substrate 110 contains crystalline silicon material, the second back surface field region 170B may include a crystalline silicon layer which is more heavily doped with impurities of the first conductive type than the substrate 110.

The second back surface field region 170B is formed by irradiating a laser beam onto the first back surface field region 170A and diffusing impurities of the first conductive type contained in the first back surface field region 170A into the substrate 110.

The back surface field region 170 performs a back surface field function and forms a potential barrier generating a potential difference between the substrate 110 and the back surface field region 170 by a difference between impurity concentrations of the substrate 110 and the back surface field region 170.

In this instance, when the substrate 110 is of the n-type and the emitter region 120 is of the p-type, the back surface field region 170 forms an n-type electric field higher than the substrate 110. Hence, the back surface field region 170 makes it easier for the major carriers (i.e., electrons) of the substrate 110 to move to the second electrode 150 through the back surface field region 170 and prevents the major carriers (i.e., holes) of the emitter region 120 from moving to the second electrode 150.

Because the first back surface field region 170A is formed of the amorphous silicon material or the microcrystalline silicon material, the first back surface field region 170A may perform the passivation function in the same manner as the back passivation layer 190.

The dielectric layer 180 is positioned on the back surface field region 170 and has a plurality of openings at a location overlapping the openings of the back surface field region 170. Namely, the opening of the dielectric layer 180 is formed at the same location as the opening of the back surface field region 170, and a width or a diameter of the opening of dielectric layer 180 may be the same as the opening of the back surface field region 170.

The dielectric layer 180 may be formed of at least one of silicon nitride (SiNx), silicon oxide (SiOx), and silicon oxynitride (SiOxNy) and may have a single-layered structure or a multi-layered structure.

Preferably, but not required, the dielectric layer 180 may be formed of silicon nitride (SiNx) having a relatively low process temperature, so as to minimize a heat damage of the back passivation layer 190 and the first back surface field region 170A considering that the back passivation layer 190 and the first back surface field region 170A contain the amorphous silicon material.

The dielectric layer 180 functions to partially bring the second electrode 150 into contact with the substrate 110 and the back surface field region 170 only through the plurality of openings of the dielectric layer 180. Namely, the dielectric layer 180 prevents the second electrode 150 from contacting the entire back surface of the substrate 110 and the entire back surface of the first back surface field region 170A.

The second electrode 150 contains a conductive material and is positioned on a back surface of the dielectric layer 180. The second electrode 150 includes a plurality of connection electrodes 155, which are respectively positioned in the plurality of openings included in each of the back passivation layer 190, the first back surface field region 170A, and the dielectric layer 180.

Hence, the second electrode 150 is electrically connected to the first back surface field region 170A and the second back surface field region 170B. Namely, as shown in FIGS. 1 to 3, the second electrode 150 directly contacts the first back surface field region 170A and the second back surface field region 170B and is electrically connected to them.

The second electrode 150 includes the plurality of connection electrodes 155, a back electrode layer 151, and a plurality of back bus bars 153.

The plurality of connection electrodes 155 are respectively positioned in the plurality of openings included in each of the back passivation layer 190, the first back surface field region 170A, and the dielectric layer 180. The plurality of connection electrodes 155 directly contact the second back surface field region 170B positioned at the substrate 110.

It is preferable, but not required, that the plurality of connection electrodes 155 are formed through a plating method, which is performed at a relatively low process temperature, so as to minimize a damage of the back passivation layer 190 and the first back surface field region 170A resulting from heat considering that the back passivation layer 190 and the first back surface field region 170A contain the amorphous silicon material. As described above, because the connection electrodes 155 may be formed through the plating method at the low process temperature, the passivation function of the back passivation layer 190 may be maximized.

The back electrode layer 151 is entirely positioned on the dielectric layer 180 except a formation area of the back bus bars 153. The back electrode layer 151 may directly contact the plurality of connection electrodes 155.

The back electrode layer 151 may be formed of at least one selected from the group consisting of nickel (Ni), copper (Cu), silver (Ag), tin (Sn), zinc (Zn), indium (In), titanium (Ti), gold (Au), and a combination thereof. Other conductive materials may be used.

The back electrode layer 151 is formed through one of a plating method and an evaporation method, which are performed at a relatively low process temperature, so as to minimize a heat damage of the back passivation layer 190 and the first back surface field region 170A. Other methods, which are performed at a relatively low process temperature, may be used.

The plurality of back bus bars 153 are positioned on the back surface field region 170 and directly contact and are electrically connected to the back electrode layer 151. The back bus bars 153 extend in the same direction as the front bus bars 143 to form a stripe arrangement. The back bus bars 153 may be positioned opposite the front bus bars 143.

The back bus bars 153 directly contact the interconnector in the same manner as the front bus bars 143 and output carriers, which are collected from the substrate 110 to the back electrode layer 151, to the external device.

It is preferable, but not required, that the back bus bars 153 are formed of a conductive material, for example, silver (Ag). However, the back bus bars 153 may be formed of at least one selected from the group consisting of nickel (Ni), copper (Cu), aluminum (Al), tin (Sn), zinc (Zn), indium (In), titanium (Ti), gold (Au), and a combination thereof. Other conductive materials may be used.

The back bus bars 153 are formed through one of a plating method and an evaporation method, which are performed at a relatively low process temperature, in the same manner as the back electrode layer 151.

So far, the embodiment of the invention described the structure of the second electrode 150 including the back electrode layer 151 and the plurality of back bus bars 153. However, other structures may be used for the second electrode 150. This is described with reference to FIGS. 13 and 14.

Figure 13:
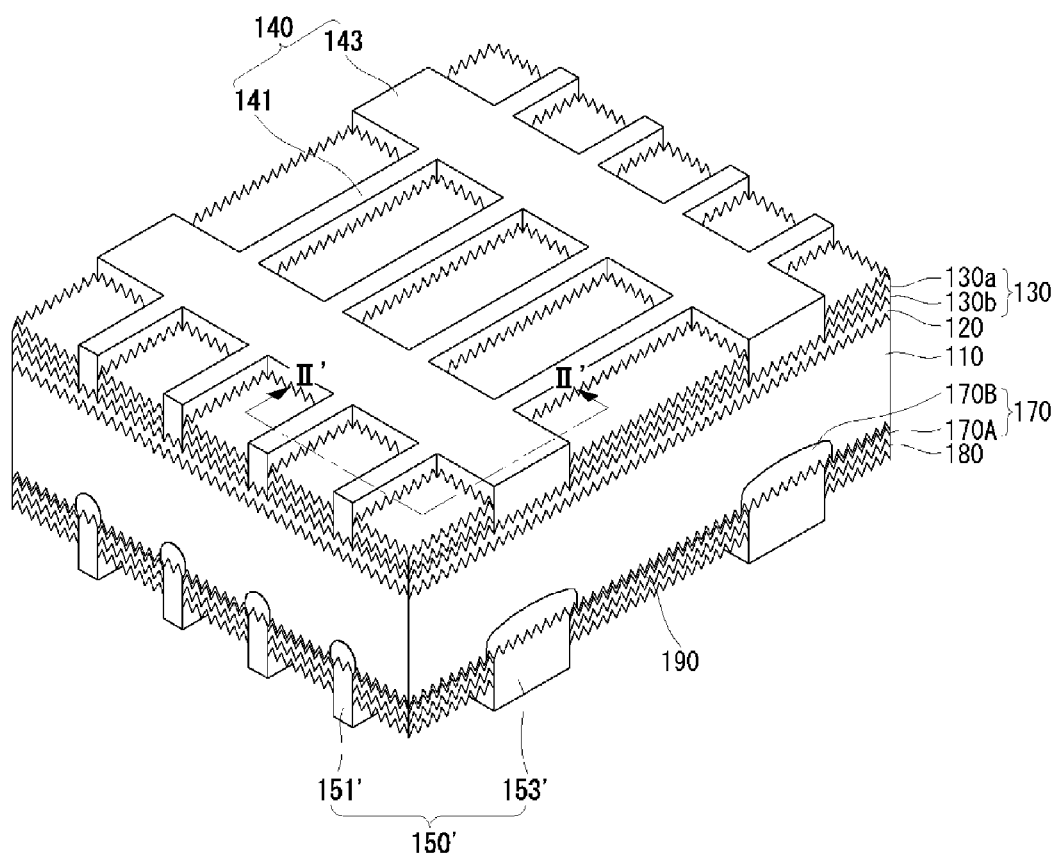
FIG. 13 is a partial perspective view of a solar cell according to another example embodiment of the invention.
Figure 14:
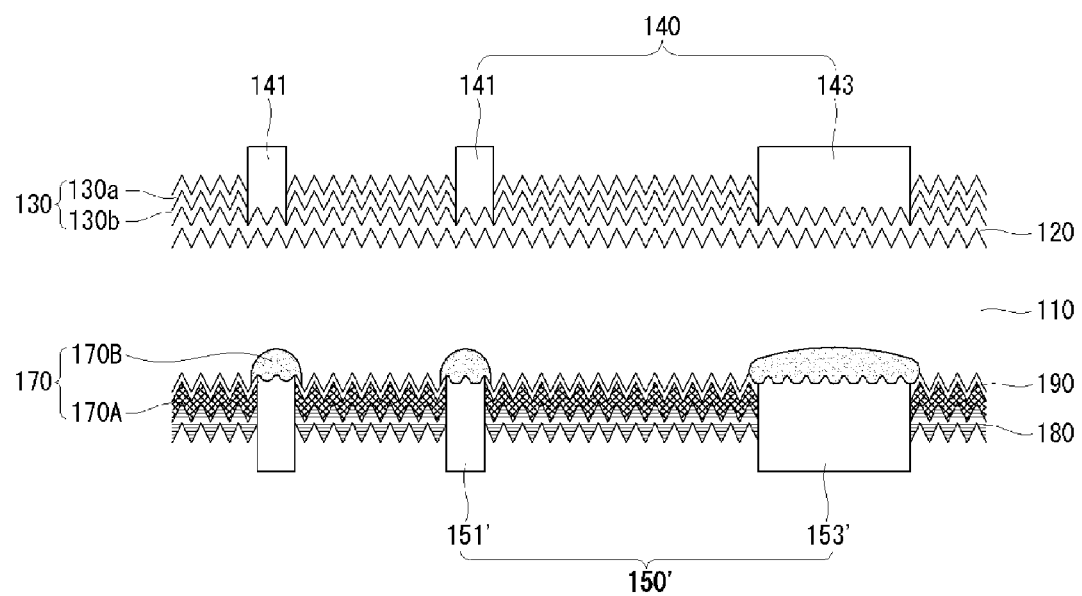
FIG. 14 is a cross-sectional view taken along line II'-II' of FIG. 13.

FIG. 13 is a partial perspective view of a solar cell according to another example embodiment of the invention, and FIG. 14 is a cross-sectional view taken along line II'-II' of FIG. 13.

Since configuration of the solar cell illustrated in FIGS. 13 and 14 is substantially the same as configuration of the solar cell illustrated in FIGS. 1 to 3 except a structure of a second electrode 150', a further description may be briefly made or may be entirely omitted.

The second electrode 150' has the same structure as a first electrode 140 so as to form a structure of a bifacial solar cell. Namely, the second electrode 150' includes a plurality of back finger electrodes 151' extending in a first direction and a plurality of back bus bars 153' which extend in a second direction crossing the first direction and connect the plurality of back finger electrodes 151' to one another.

A back passivation layer 190, a first back surface field region 170A, and a dielectric layer 180 each have a plurality of openings which are formed at an overlap location of the components 190, 170A, and 180 and expose a second back surface field region 170B formed at a back surface of a substrate 110. Because the openings are filled with the back finger electrodes 151', the second electrode 150' is electrically connected to the substrate 110 through the second back surface field region 170B.

An operation of the solar cell having the above-described structure according to the embodiments of the invention is described below.

When light irradiated to the solar cell is incident on the substrate 110 through the anti-reflection layer 130 and the emitter region 120, a plurality of electron-hole pairs are generated in the substrate 110 by light energy produced based on the incident light. In this instance, a reflection loss of the light incident on the substrate 110 is reduced by the anti-reflection layer 130, and thus an amount of light incident on the substrate 110 increases.

The electron-hole pairs are separated into electrons and holes due to the p-n junction of the substrate 110 and the emitter region 120. The electrons move to the n-type substrate 110, and the holes move to the p-type emitter region 120. The holes moving to the emitter region 120 are collected by the finger electrodes 141 and then are transferred and collected to the front bus bars 143. The electrons moving to the substrate 110 are collected to the back electrode layer 151 through the connection electrodes 155 and then are transferred to the back bus bars 153. When the front bus bars 143 are connected to the back bus bars 153 using conductive wires, current flows therein to thereby enable use of the current for electric power.

As described above, in the solar cell according to the embodiment of the invention, the back surface field region 170 includes the first back surface field region 170A, which is positioned on the back surface of the back passivation layer 190 and has the plurality of openings, and the second back surface field region 170B which is positioned in the back surface of the substrate 110 exposed by the plurality of openings of the back passivation layer 190.

In the embodiment of the invention, the first back surface field region 170A performs both the back surface field function and the passivation function, and the second back surface field region 170B performs the back surface field function.

The structure of the solar cell according to the embodiment of the invention prevents or reduces carriers moving to the second electrode 150 from being recombined and/or disappearing at and around the back surface of the substrate 110, thereby increasing an open-circuit circuit Jsc and a fill factor F.F of the solar cell. As a result, the efficiency of the solar cell may increase.

More specifically, the structure of the solar cell according to the embodiment of the invention forms the second back surface field region 170B at the back surface of the substrate 110, forms the back passivation layer 190 on the back surface of the substrate 110, and forms the first back surface field region 170A, which performs both the back surface field function and the passivation function, on the back passivation layer 190. Thus, in the embodiment of the invention, because both the back passivation layer 190 and the first back surface field region 170A perform the passivation function of the back surface of the substrate 110, the passivation function is further enhanced. Further, because both the first back surface field region 170A and the second back surface field region 170B perform the back surface field function of the back surface of the substrate 110, the back surface field function is further enhanced.

When the major carriers (for example, electrons) of the substrate 110 move to the back surface of the substrate 110, the embodiment of the invention reduces an amount of carriers recombined by dangling bonds existing at and around the back surface of the substrate 110 and thus reduces a magnitude of a dark saturation current Jo generating the combination of the carriers. Further, the embodiment of the invention makes it easier for the major carriers (for example, electrons) of the substrate 110 to move to the second electrode 150 through the back surface field region 170, and at the same time prevents the major carriers (for example, holes) of the emitter region 120 from moving to the second electrode 150.

In the embodiment of the invention, the second back surface field region 170B includes the crystalline silicon layer which is more heavily doped with impurities of the first conductive type than the substrate 110. Hence, the solar cell according to the embodiment of the invention may further reduce a resistance of the second back surface field region 170B, and thus the movement of carriers from the substrate 110 to the second electrode 150 may be more smoothly performed.

Further, as shown in FIG. 3, the first back surface field region 170A positioned on the back passivation layer 190 includes a microcrystalline silicon layer 170A2 which is more heavily doped with impurities of the first conductive type than the substrate 110.

The microcrystalline silicon layer 170A2 of the first back surface field region 170A makes it possible to use a laser beam having a lower laser energy density when a laser beam is irradiated onto the back surface of the substrate 110 to form the second back surface field region 170B in a process for manufacturing the solar cell.

Hence, the microcrystalline silicon layer 170A2 of the first back surface field region 170A prevents or reduces the damage of the substrate 110 resulting from the laser beam used when the second back surface field region 170B is formed at the back surface of the substrate 110, thereby minimizing the generation of the dark saturation current Jo. Further, the microcrystalline silicon layer 170A2 of the first back surface field region 170A causes the second back surface field region 170B formed at the back surface of the substrate 110 to have a sheet resistance of a desired magnitude. This is described in detail below with reference to FIGS. 4 and 5.

The first back surface field region 170A further includes an amorphous silicon layer 170A1 which is positioned between the back passivation layer 190 and the microcrystalline silicon layer 170A2 and contains impurities of the first conductive type. In the first back surface field region 170A, a doping concentration of the amorphous silicon layer 170A1 is lower than a doping concentration of the microcrystalline silicon layer 170A2.

The amorphous silicon layer 170A1 of the first back surface field region 170A makes it possible to form an ohmic contact between the back passivation layer 190 including the intrinsic amorphous silicon layer and the microcrystalline silicon layer 170A2 of the first back surface field region 170A.

The amorphous silicon layer 170A1 of the first back surface field region 170A may further enhance the passivation function of the back passivation layer 190 including the intrinsic amorphous silicon layer.

A sheet resistance of the first back surface field region 170A gradually decreases as it goes from the amorphous silicon layer 170A1 of a relatively low concentration to the microcrystalline silicon layer 170A2 of a relatively high concentration. Hence, the movement of carriers from the first back surface field region 170A to the second electrode 150 may be more smoothly performed.

Each connection electrode 155 of the second electrode 150 directly contacts the first back surface field region 170A and the second back surface field region 170B. In this instance, the first back surface field region 170A and the second back surface field region 170B are spatially separated from each other, but are electrically connected to each other through the second electrode 150.

A thickness T170A of the first back surface field region 170A is about 10 nm to 50 nm, and a doping depth D170B of the second back surface field region 170B is about 3 μm to 5 μm.

A distance D1 between the plurality of openings of the first back surface field region 170A is about 0.15 mm to 1 mm.

A plane shape of the plurality of openings of the first back surface field region 170A may be a line shape or a dot shape.

More specifically, when the plane shape of the plurality of openings of the first back surface field region 170A is the line shape, a distance between the lines is about 0.3 mm to 1 mm. Further, when the plane shape of the plurality of openings of the first back surface field region 170A is the dot shape, a distance between the dots is 0.15 mm to 1 mm.

In the embodiment of the invention, the laser beam is irradiated onto the substrate 110 to form the plurality of openings of the first back surface field region 170A. In this instance, when the distance D1 between the openings is excessively narrow, an area of the substrate 110, onto which the laser beam is irradiated, excessively increases. Hence, the characteristics of the substrate 110 may be reduced. On the contrary, when the distance D1 between the openings is excessively wide, the fill factor of the solar cell may be reduced. Therefore, the distance D1 between the openings of the first back surface field region 170A is defined as described above.

As described above, the dielectric layer 180 may be formed of at least one of silicon nitride (SiNx), silicon oxide (SiOx), and silicon oxynitride (SiOxNy). Preferably, but not required, the dielectric layer 180 is formed of silicon nitride (SiNx). In the embodiment of the invention, because the dielectric layer 180 is formed of silicon nitride (SiNx) which is processed at a relatively low process temperature (for example, about 300° C. to 400° C.), it is possible to minimize a heat damage of the back passivation layer 190 including the intrinsic amorphous silicon layer or the amorphous silicon layer 170A1 of the first back surface field region 170A resulting from the process temperature of the dielectric layer 180 in the process for forming the dielectric layer 180.

When the first back surface field region 170A and the second back surface field region 170B in the solar cell having the structure illustrated in FIGS. 1 to 3 are formed, an effect obtained when the first back surface field region 170A includes the microcrystalline silicon layer 170A2 is described below with reference to FIGS. 4 and 5.

Figure 4:
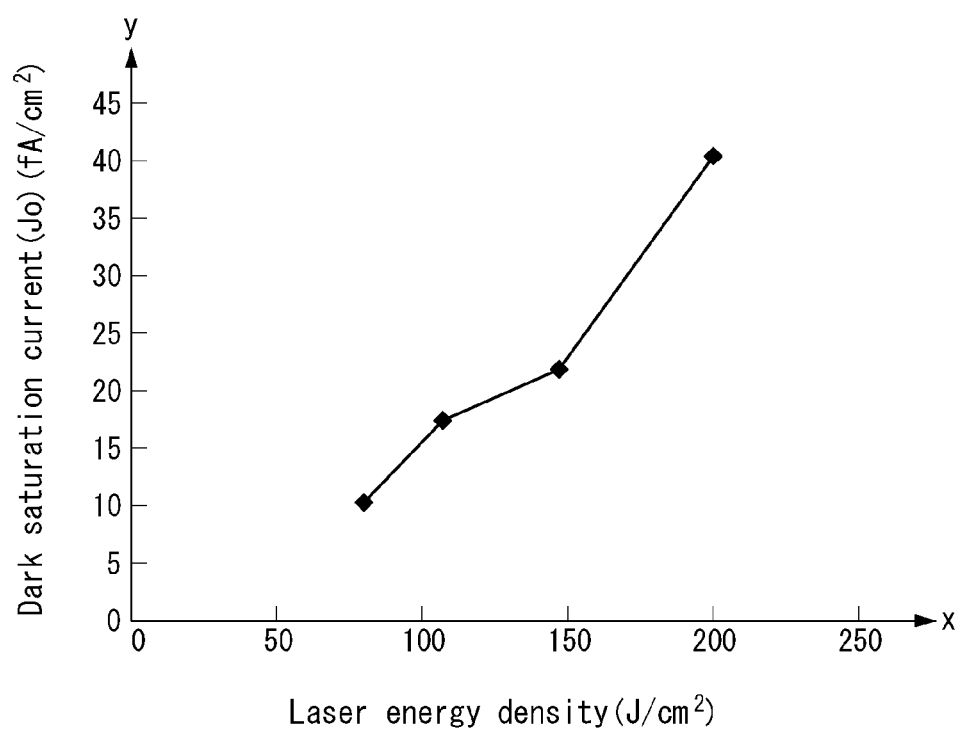
FIG. 4 illustrates a relationship between an energy density of a laser beam and a dark saturation current generated in a solar cell through the irradiation of the laser beam when the laser beam is irradiated onto a back surface of a substrate to form a back surface field region.

FIG. 4 illustrates a relationship between an energy density of the laser beam and a dark saturation current Jo generated in the solar cell through the irradiation of the laser beam when the laser beam is irradiated onto the back surface of the substrate 110 to form the back surface field region 170.

As shown in FIG. 4, the dark saturation current Jo and the energy density of the laser beam are proportional to each other.

As described above, the dark saturation current Jo is a current value generating the combination of carriers. Thus, as the dark saturation current Jo increases, an amount of combined carriers increases. Hence, a short circuit current Jsc and the efficiency of the solar cell are reduced.

In other words, a passivation effect of the solar cell increases as the dark saturation current Jo decreases, and also the passivation effect of the solar cell decreases as the dark saturation current Jo increases. Thus, the less the dark saturation current Jo is, the greater the efficiency of the solar cell is.

As shown in FIG. 4, impurities of the first conductive type are diffused into the back surface of the substrate 110, and the laser beam is selectively irradiated onto the back surface of the substrate 110 to locally form the second back surface field region 170B at the back surface of the substrate 110.

In this instance, the energy density of the laser beam has to increase so as to properly reduce a sheet resistance of the second back surface field region 170B selectively formed at the back surface of the substrate 110.

However, as shown in FIG. 4, when the laser energy density increases, the dark saturation current Jo increases. Hence, even when the second back surface field region 170B is formed at the back surface of the substrate 110, the efficiency of the solar cell does not increase to a desired level.

However, as in the embodiment of the invention, when the first back surface field region 170A includes the microcrystalline silicon layer 170A2, the sheet resistance of the second back surface field region 170B may be properly reduced to a desired level even if a laser beam having a relatively low energy density is used.

Namely, in the embodiment of the invention, the microcrystalline silicon layer 170A2 included in the first back surface field region 170A may be used as a dopant layer for forming the second back surface field region 170B. The laser beam may be selectively irradiated onto the microcrystalline silicon layer 170A2 used as the dopant layer to locally form the second back surface field region 170B, is more heavily doped than the substrate 110, at the back surface of the substrate 110.

Figure 5:
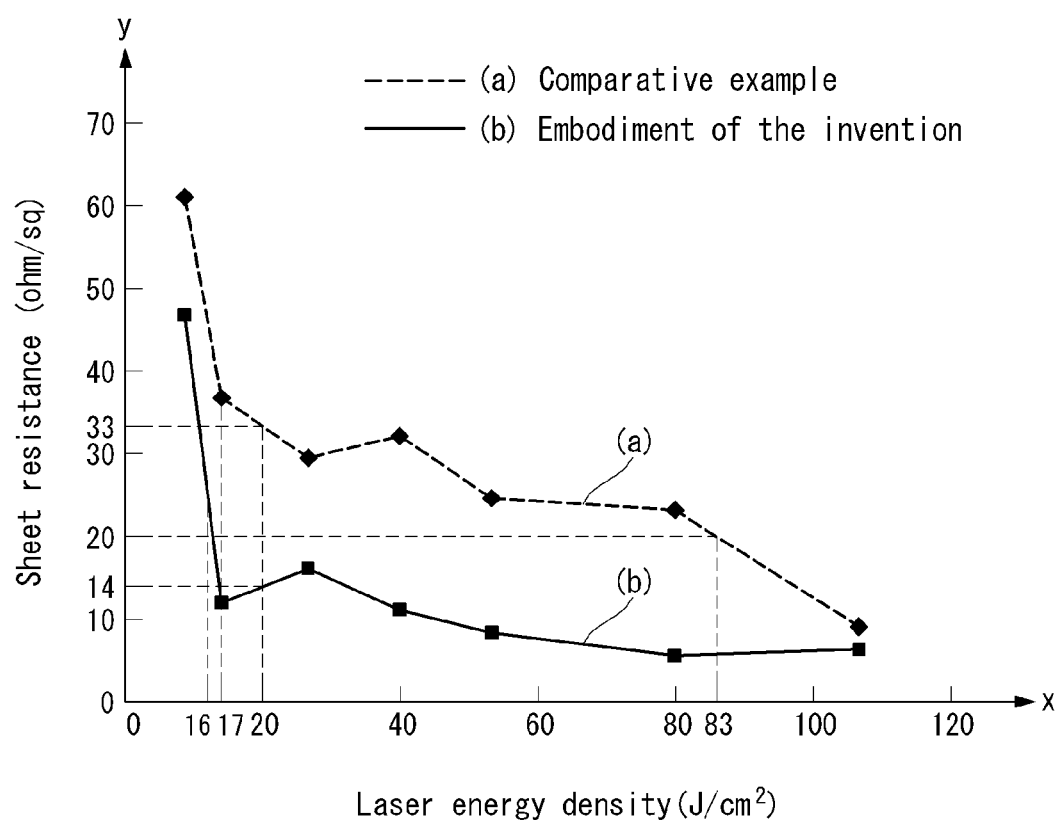
FIG. 5 illustrates an effect obtained when a first back surface field region includes a microcrystalline silicon layer when a laser beam is irradiated onto the microcrystalline silicon layer included in the first back surface field region to form a second back surface field region according to an embodiment of the invention.

FIG. 5 illustrates an effect obtained when the first back surface field region 170A includes the microcrystalline silicon layer 170A2 when the laser beam is irradiated onto the microcrystalline silicon layer 170A2 included in the first back surface field region 170A to form the second back surface field region 170B according to the embodiment of the invention.

In FIG. 5, x-axis indicates a laser energy density, and y-axis indicates the sheet resistance of the second back surface field region 170B formed at the back surface of the substrate 110.

In FIG. 5, (a) is a comparative example where when the laser beam is irradiated onto the first back surface field region 170A used as a dopant to form the second back surface field region 170B at the back surface of the substrate 110, the first back surface field region 170A does not include the microcrystalline silicon layer 170A2 and includes an amorphous silicon layer as the dopant layer. Further, (b) of FIG. 5 is the embodiment of the invention where when the laser beam is irradiated onto the first back surface field region 170A used as a dopant to form the second back surface field region 170B at the back surface of the substrate 110, the first back surface field region 170A includes the microcrystalline silicon layer 170A2. (b) of FIG. 5 according to the embodiment of the invention may be applied to an example where the first back surface field region 170A includes the amorphous silicon layer 170A1 as well as the microcrystalline silicon layer 170A2 as shown in FIG. 3.

As shown in (a) and (b) of FIG. 5, in the comparative example and the embodiment of the invention, the energy density of the laser beam has to increase so as to form the second back surface field region 170B having a sufficiently low sheet resistance at the back surface of the substrate 110.

As shown in (a) and (b) of FIG. 5, when the energy density of the laser beam is equal to or less than about 17 $J/cm^2$, the sheet resistance of the second back surface field region 170B sharply decreases. However, when the energy density of the laser beam is greater than about 17 $J/cm^2$, the sheet resistance of the second back surface field region 170B gradually decreases. Further, the sheet resistance of the second back surface field region 170B in the embodiment of the invention is less than the sheet resistance of the second back surface field region 170B in the comparative example depending on the energy density of the laser beam.

For example, when the energy density of the laser beam is equal to or less than about 100 $J/cm^2$ (i.e., when the energy density of the laser beam is about 20 $J/cm^2$, 40 $J/cm^2$, 60 $J/cm^2$, and 80 $J/cm^2$), the sheet resistance of the second back surface field region 170B in the embodiment of the invention shown in (b) of FIG. 5 is much less than the sheet resistance of the second back surface field region 170B in the comparative example shown in (a) of FIG. 5.

More specifically, when the back surface field region 170 is formed at the back surface of the substrate 110 using the laser beam having the energy density of about 20 $J/cm^2$, the sheet resistance of the second back surface field region 170B in the comparative example shown in (a) of FIG. 5 is about 33 Ω. On the other hand, the sheet resistance of the second back surface field region 170B in the embodiment of the invention shown in (b) of FIG. 5 is about 14 Ω and is much less than the comparative example.

When the sheet resistance of the second back surface field region 170B required in the solar cell is equal to or less than about 20 Ω, the laser beam having the energy density equal to or greater than about 83 $J/cm^2$ has to be used in the comparative example shown in (a) of FIG. 5.

On the other hand, in the embodiment of the invention shown in (b) of FIG. 5, the laser beam having the energy density of about 16 $J/cm^2$ which is much less than about 83 $J/cm^2$ may be used. Hence, the dark saturation current Jo may be greatly reduced as shown in FIG. 4, and an amount of combined carriers may greatly decrease.

As a result, the short circuit current Jsc and the efficiency of the solar cell may further increase.

Further, in the solar cell according to the embodiment of the invention, a thickness T190 of the back passivation layer 190 including the intrinsic amorphous silicon layer may be about 10 nm to 50 nm, so as to further reduce the dark saturation current Jo.

As described above, when the thickness T190 of the back passivation layer 190 is equal to or greater than about 10 nm, the generation of the dark saturation current Jo is further reduced, and the passivation effect of the back passivation layer 190 further increases. Further, the thickness T190 of the back passivation layer 190 is set to be equal to or less than about 50 nm in consideration of the manufacturing time and the manufacturing cost of the solar cell in a state where the dark saturation current Jo is sufficiently reduced.

Figure 6:
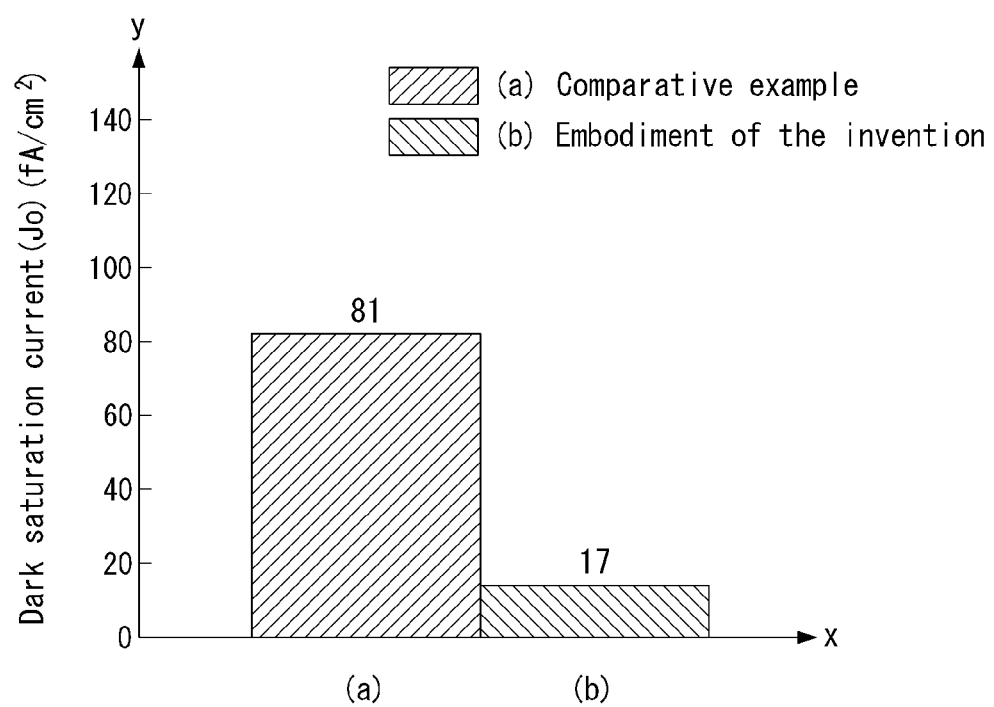
FIG. 6 illustrates an effect of a thickness of a back passivation layer according to an embodiment of the invention.

FIG. 6 illustrates an effect of the thickness of the back passivation layer 190 according to the embodiment of the invention.

In FIG. 6, (a) is a comparative example where the dark saturation current Jo generated in the solar cell is measured when the thickness T190 of the back passivation layer 190 is about 2.5 nm, and (b) is the embodiment of the invention where the dark saturation current Jo generated in the solar cell is measured when the thickness T190 of the back passivation layer 190 is about 20 nm.

As shown in FIG. 6, when the thickness T190 of the back passivation layer 190 is relatively thin as in the comparative example shown in (a) of FIG. 6, the dark saturation current Jo has a relatively high value of about 81 $fA/cm^2$. On the other hand, when the thickness T190 of the back passivation layer 190 is relatively thick (for example, about 10 nm to 50 nm) as in the embodiment of the invention shown in (b) of FIG. 6, the dark saturation current Jo is relatively reduced.

Accordingly, when the thickness T190 of the back passivation layer 190 is about 10 nm to 50 nm as in the embodiment of the invention, the dark saturation current Jo of the solar cell may be further reduced. As a result, the short circuit current Jsc and the efficiency of the solar cell may further increase.

As described above, the solar cell according to the embodiment of the invention is configured so that the back surface field region 170 includes the first back surface field region 170A positioned on the back surface of the back passivation layer 190 and the second back surface field region 170B positioned in the back surface of the substrate 110 exposed through the plurality of openings of the back passivation layer 190. Hence, the passivation function and the back surface field function of the solar cell may be further enhanced.

Further, the solar cell according to the embodiment of the invention is configured so that the first back surface field region 170A includes the microcrystalline silicon layer 170A2 which is more heavily doped with impurities of the first conductive type than the substrate 110. Hence, the dark saturation current Jo of the solar cell may be further reduced, and the passivation function of the solar cell may be further enhanced.

Further, the solar cell according to the embodiment of the invention is configured so that the back passivation layer 190 includes the intrinsic amorphous silicon layer and the thickness T190 of the back passivation layer 190 is about 10 nm to 50 nm. Hence, the passivation function of the solar cell may be further enhanced.

So far, the structure of the solar cell according to the embodiment of the invention was described. Hereinafter, a method for manufacturing the solar cell according to the embodiment of the invention is described.

FIGS. 7 to 12 illustrate a method for manufacturing the solar cell according to the embodiment of the invention.

Figure 7:
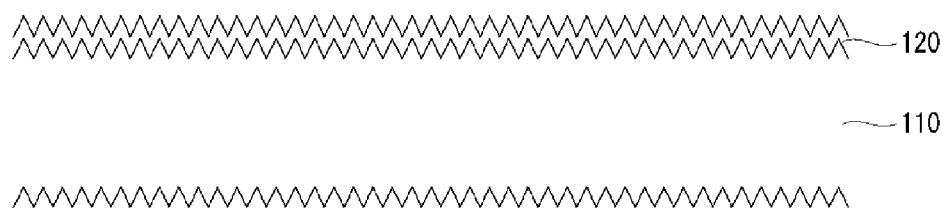
FIGS. 7 to 12 illustrate a method for manufacturing a solar cell according to an example embodiment of the invention.

As shown in FIG. 7, an emitter region 120 containing impurities of a second conductive type opposite a first conductive type is formed at a front surface of a substrate 110 containing impurities of the first conductive type.

As shown in FIG. 7, both a front surface and a back surface of the substrate 110 may be textured to form a textured surface corresponding to an uneven surface having a plurality of uneven portions or having uneven characteristics. Alternatively, only the front surface of the substrate 110 may be textured to form a textured surface corresponding to an uneven surface having a plurality of uneven portions or having uneven characteristics.

The substrate 110 is placed in a thermal diffusion furnace in a state the substrate 110 contains the impurities of the first conductive type and the surface of the substrate 110 is textured to form the textured surface. Then, a process gas containing impurities of the second conductive type is diffused into the front surface of the substrate 110 to form the emitter region 120.

Alternatively, a dopant paste containing impurities of the second conductive type may be applied to the front surface of the substrate 110 and may be diffused into the thermal diffusion furnace to form the emitter region 120. As described above, a method for forming the emitter region 120 is not particularly limited.

Figure 8:
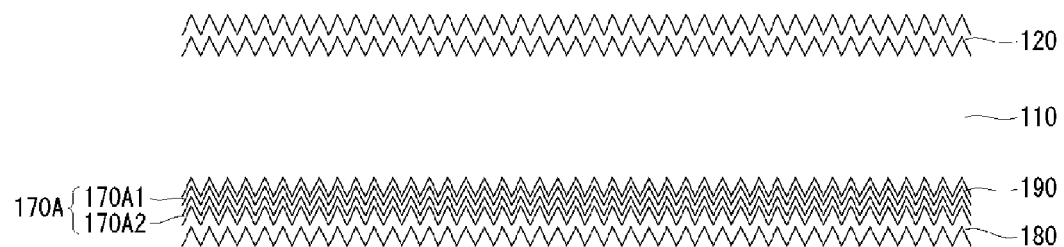

Next, as shown in FIG. 8, a back passivation layer 190 including an intrinsic amorphous silicon layer is formed on the back surface of the substrate 110, and then a first back surface field region 170A is formed on the back passivation layer 190. The first back surface field region 170A includes an amorphous silicon layer 170A1 and a microcrystalline silicon layer 170A2.

A process for forming the first back surface field region 170A includes forming the amorphous silicon layer 170A1 containing impurities of the first conductive type on the back passivation layer 190 and forming the microcrystalline silicon layer 170A2, which is more heavily doped with impurities of the first conductive type than the substrate 110, on the amorphous silicon layer 170A1.

In the embodiment of the invention, a doping concentration of the amorphous silicon layer 170A1 may be lower than a doping concentration of the microcrystalline silicon layer 170A2.

FIG. 8 shows an example where the first back surface field region 170A includes the amorphous silicon layer 170A1 and the microcrystalline silicon layer 170A2. However, the amorphous silicon layer 170A1 may be omitted, if necessary or desired.

If the amorphous silicon layer 170A1 is omitted, the microcrystalline silicon layer 170A2 of the first back surface field region 170A may directly contact the surface of the back passivation layer 190.

As shown in FIG. 8, after the first back surface field region 170A is formed, a dielectric layer 180 formed of silicon nitride (SiNx) is formed on the first back surface field region 170A. The dielectric layer 180 is formed at a process temperature of about 300° C. to 400° C.

Because the dielectric layer 180 is formed at the relatively low process temperature, a reduction or degradation in characteristics of the back passivation layer 190 formed of intrinsic amorphous silicon may be minimized. Hence, a reduction in a passivation function of the back passivation layer 190 may be minimized.

Alternatively, other materials may be used for the dielectric layer 180. For example, the dielectric layer 180 may be formed of silicon oxide (SiOx) and silicon oxynitride (SiOxNy) which are processed at a process temperature higher than silicon nitride (SiNx), instead of silicon nitride (SiNx).

Figure 9:
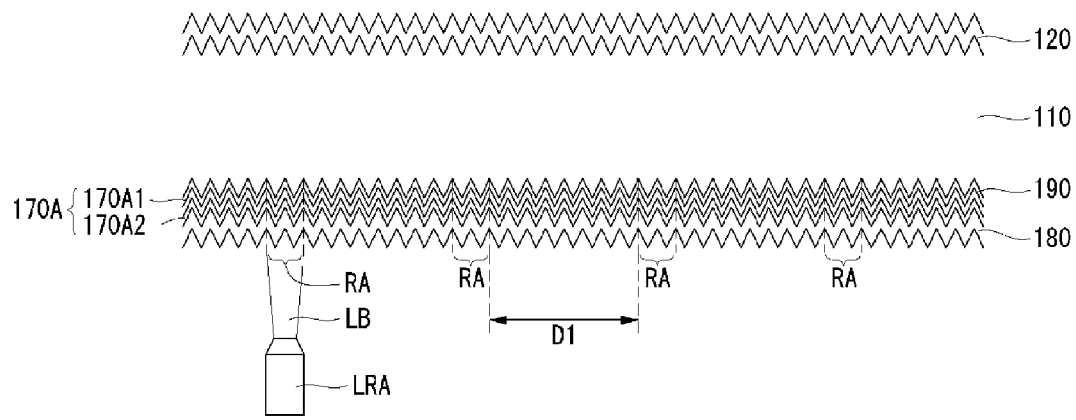
Figure 10:
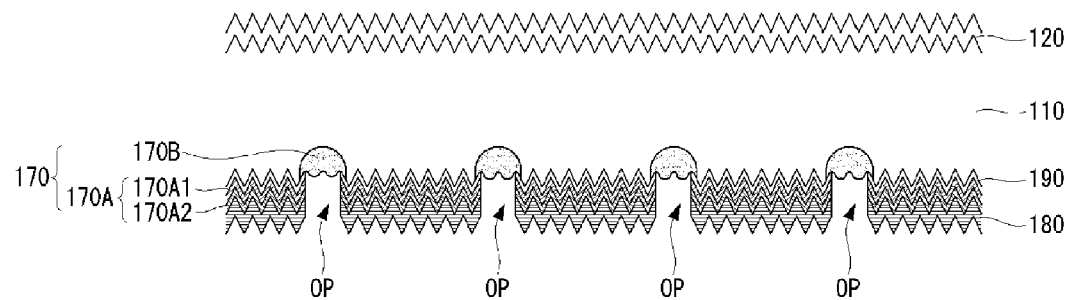

Next, as shown in FIG. 9, a laser beam LB is selectively irradiated onto a portion RA of the dielectric layer 180, so that the back passivation layer 190, the first back surface field region 170A, and the dielectric layer 180 formed at the back surface of the substrate 110 each have a plurality of openings OP as shown in FIG. 10.

As shown in FIG. 9, when the laser beam LB is selectively irradiated onto the portion RA of the dielectric layer 180, the impurities of the first conductive type contained in the first back surface field region 170A are diffused into the back surface of the substrate 110 through the laser beam LB.

The portion RA of the dielectric layer 180, onto which the laser beam LB is irradiated, is etched and removed by the laser beam LB. A silicon material forming the first back surface field region 170A and the back passivation layer 190 is melted in an area of the first back surface field region 170A and an area of the back passivation layer 190, onto which the laser beam LB is irradiated. Then, the silicon material is absorbed in the back surface of the substrate 110 and is recrystallized.

Further, an oxide layer may be formed on the back surface of the substrate 110 exposed by the openings OP of each of the dielectric layer 180, the first back surface field region 170A, and the back passivation layer 190 through the irradiation of the laser beam LB. The oxide layer is removed through a cleaning process after the irradiation of the laser beam LB is completed.

A plane shape of the laser beam LB, which is selectively irradiated onto the portion RA of the dielectric layer 180 using a laser irradiation device LRA, may be a line shape or a dot shape. In this instance, a distance between the portions RA may be 0.15 mm to 1 mm. As shown in FIG. 10, the back passivation layer 190, the first back surface field region 170A, and the dielectric layer 180 each have the plurality of openings OP through the irradiation of the laser beam LB. Impurities of the first conductive type contained in the first back surface field region 170A are diffused into the back surface of the substrate 110 due to the laser beam LB. The silicon material forming the first back surface field region 170A and the back passivation layer 190 is melted in an area of the first back surface field region 170A and an area of the back passivation layer 190, onto which the laser beam LB is irradiated. Then, the silicon material is absorbed in the back surface of the substrate 110 and is recrystallized. Hence, a second back surface field region 170B is formed in the back surface of the substrate 110 exposed by the plurality of openings OP.

Figure 11:
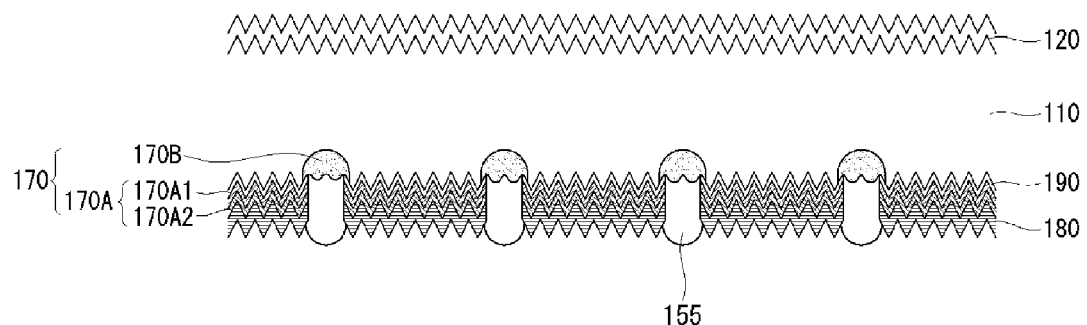

Next, as shown in FIG. 11, a plurality of connection electrodes 155 of a second electrode 150, which is connected to the first back surface field region 170A and the second back surface field region 170B, are formed. It is preferable, but not required, that the connection electrodes 155 of the second electrode 150 are formed using a plating method so as to minimize a heat damage of the back passivation layer 190 and the amorphous silicon layer 170A1 included in the first back surface field region 170A.

Figure 12:
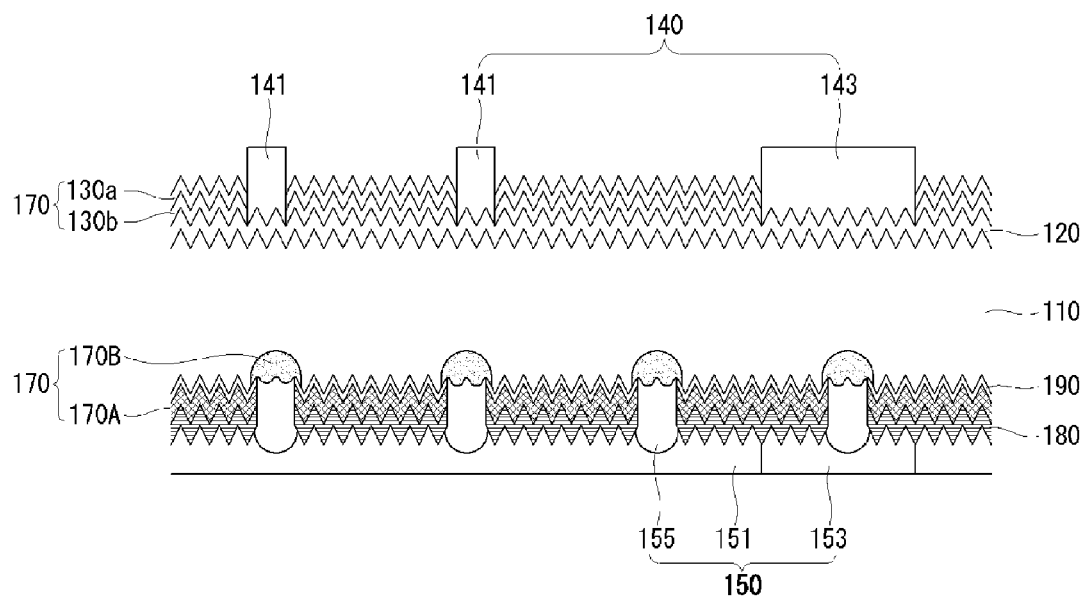

Next, as shown in FIG. 12, an anti-reflection layer 130 and a first electrode 140 are sequentially formed on the emitter region 120 formed at the front surface of the substrate 110. A back electrode layer 151 and a plurality of back bus bars 153 are formed on the dielectric layer 180 positioned on the back surface of the substrate 110 to complete the second electrode 150 including the back electrode layer 151, the back bus bars 153, and the connection electrodes 155.

The embodiment of the invention describes that the anti-reflection layer 130 or the first electrode 140 is formed on the front surface of the substrate 110 after the back passivation layer 190, the first back surface field region 170A, the second back surface field region 170B, and the dielectric layer 180 are formed on the back surface of the substrate 110. However, unlike this, after the emitter region 120 is formed at the front surface of the substrate 110, the anti-reflection layer 130 or the first electrode 140 may be formed irrespective of the formation order.

For example, after the emitter region 120 is formed at the front surface of the substrate 110, the anti-reflection layer 130 or the first electrode 140 may be formed before the back passivation layer 190, the first back surface field region 170A, the second back surface field region 170B, and the dielectric layer 180 are formed.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell comprising:
    a substrate containing impurities of a first conductive type;
    an emitter region positioned at a front surface of the substrate, the emitter region containing impurities of a second conductive type opposite the first conductive type;
    a back passivation layer positioned on a back surface of the substrate;
    a first back surface field region positioned on the back passivation layer and having impurities of the first conductive type;
    a dielectric layer positioned on the back passivation layer;
    a plurality of openings through the back passivation layer, the first back surface field region and the dielectric layer;
    a second back surface field region, wherein the second back surface field region is a portion of the back surface of the substrate, wherein the second back surface field region is doped with the impurities of the first conductivity type and exposed by the plurality of openings, and wherein the back passivation layer is between the first back surface field region and the second back surface field region;
    a first electrode connected to the emitter region;
    a second electrode connected to the second back surface field region;
    wherein the first back surface field region directly contacts the back passivation layer and the dielectric layer.

2. The solar cell of claim 1, wherein the second back surface field region includes a crystalline silicon layer which is more heavily doped with the impurities of the first conductive type than the substrate.

3. The solar cell of claim 1, wherein the first back surface field region includes a microcrystalline silicon layer which is more heavily doped with the impurities of the first conductive type than the substrate.

4. The solar cell of claim 3, wherein the first back surface field region further includes an amorphous silicon layer which is positioned between the back passivation layer and the microcrystalline silicon layer and contains the impurities of the first conductive type.

5. The solar cell of claim 4, wherein a doping concentration of the amorphous silicon layer included in the first back surface field region is lower than a doping concentration of the microcrystalline silicon layer included in the first back surface field region.

6. The solar cell of claim 1, wherein the back passivation layer includes an intrinsic amorphous silicon layer.

7. The solar cell of claim 1, wherein the second electrode physically contacts the first back surface field region and the second back surface field region.

8. The solar cell of claim 1, wherein the first back surface field region is physically separated from the second back surface field region.

9. The solar cell of claim 1, wherein the first back surface field region and the second back surface field region are electrically connected to each other through the second electrode.

10. The solar cell of claim 1, wherein a thickness of the back passivation layer is 10 nm to 50 nm.

11. The solar cell of claim 1, wherein a thickness of the first back surface field region is 10 nm to 50 nm.

12. The solar cell of claim 1, wherein a doping depth of the second back surface field region is 3 μm to 5 μm.

13. The solar cell of claim 1, wherein a distance between the plurality of openings is 0.15 mm to 1 mm.

14. The solar cell of claim 1, wherein the dielectric layer is formed of silicon nitride (SiNx).

15. The solar cell of claim 1, wherein the second back surface field region directly contacts the back passivation layer.

* * * * *